(12) United States Patent
Rodriguez et al.

(10) Patent No.: US 12,727,106 B2
(45) Date of Patent: Sep. 1, 2026

(54) SUPPORT SPLINE FOR TRAY AND METHODS FOR MAKING AND INSTALLING SAME

(71) Applicant: CORNING RESEARCH & DEVELOPMENT CORPORATION, Corning, NY (US)

(72) Inventors: Diana Rodriguez, Mansfield, TX (US); Anthony Lynn Williams, Fort Worth, TX (US)

(73) Assignee: CORNING RESEARCH & DEVELOPMENT CORPORATION, Corning, NY (US)

( * ) Notice: Subject to any disclaimer, the term of this patent is extended or adjusted under 35 U.S.C. 154(b) by 223 days.

(21) Appl. No.: 18/581,072

(22) Filed: Feb. 19, 2024

(65) Prior Publication Data

US 2024/0314963 A1 Sep. 19, 2024

Related U.S. Application Data

(60) Provisional application No. 63/451,763, filed on Mar. 13, 2023.

(51) Int. Cl.
*H05K 7/14* (2006.01)

(52) U.S. Cl.
CPC .................................. *H05K 7/1487* (2013.01)

(58) Field of Classification Search
CPC .................................................... H05K 7/1487
See application file for complete search history.

(56) References Cited

U.S. PATENT DOCUMENTS

2011/0100668 A1* 5/2011 Syed .................... H05K 7/1491
29/745

* cited by examiner

*Primary Examiner* — Sherman Ng
(74) *Attorney, Agent, or Firm* — Kapil U. Banakar

(57) ABSTRACT

A support spline to provide support for a tray includes a generally planar main body that includes a top edge, a bottom edge, two lateral edges and an opening in a central portion of the main body that extends from the central portion of the main body to the top edge of the main body. Additionally, at least one upper flange extends away from the top edge of the main body and at least one lower flange extends away from the bottom edge of the main body. A tray having the support spline attached thereto is disclosed and a housing having a plurality of trays is disclosed. A method of making a support spline is also disclosed, as is a method of making a tray for a housing configured to be received in a distribution frame of a fiber optic network.

20 Claims, 9 Drawing Sheets

68
76
82
72
74
78
80
72
82
84
76
70

86
76
82
88
94
78
74
92
88
82
90
84
76
70

SUPPORT SPLINE FOR TRAY AND METHODS FOR MAKING AND INSTALLING SAME

PRIORITY APPLICATION

This application claims the benefit of priority of U.S. Provisional Application No. 63/451,763, filed on Mar. 13, 2023, the content of which is relied upon and incorporated herein by reference in its entirety.

TECHNICAL FIELD

This disclosure relates generally to trays for facilitating the connection of fiber optic cables in an equipment rack, and more particularly to a support spline for providing structural support for the tray. The disclosure also relates to methods for making and installing the support spline.

BACKGROUND

The large amount of data and other information transmitted over the internet has led businesses and other organizations to develop large scale data centers for organizing, processing, storing and/or disseminating large amounts of data. Data centers contain a wide range of network equipment including, for example, servers, networking switches, routers, storage subsystems, etc. Data centers further include a large amount of cabling and equipment racks to organize and interconnect the network equipment in the data center. Modern data centers may include multi-building campuses having, for example, one primary or main building and a number of auxiliary buildings in close proximity to the main building. All the buildings on the campus are interconnected by a local fiber optic network.

Data center design and cabling-infrastructure architecture are increasingly large and complex. To manage the interconnectivity of a data center, the network equipment within the buildings on the data center campus is often arranged in structured data halls having a large number of spaced-apart rows. Each of the rows is, in turn, configured to receive a number of equipment racks or cabinets (e.g., twenty racks or cabinets) which hold the network equipment. In some data center architectures, each of the rows includes a main patch panel (referred to as an intermediate distribution frame) at a front or head end of the row. Distribution cables with a relatively large number of optical fibers (high fiber counts) are routed from a building distribution frame (referred to as a main distribution frame) to the intermediate distribution frames for the different rows of equipment racks. At the intermediate distribution frames, a large number of distribution fiber optic cables with lower fiber counts are connected to the optical fibers of the associated high fiber count distribution cable(s) and routed along the row to connect to the network equipment held in the various racks in the row. To organize the large number of in-row distribution fiber optic cables, each row typically includes a cable tray or basket disposed above the row for supporting the distribution fiber optic cables as they extend along the row. The network equipment in the racks is optically connected to the distribution fiber optic cables by technicians during the construction of the data center using a large number of jumper cables.

While current data center design and cabling-infrastructure architecture are satisfactory for the current needs of the industry, the labor, installation time, and costs to achieve the interconnectivity of the data center can be high. For these reasons, manufacturers continually strive to improve the interconnectivity in the data center.

SUMMARY

In one aspect of the disclosure, a support spline to provide support for a tray is disclosed. The support spline includes a generally planar main body that includes a top edge, a bottom edge, and two lateral edges and an opening in a central portion of the main body that extends from the central portion of the main body to the top edge of the main body. Additionally, at least one upper flange extends away from the top edge of the main body and at least one lower flange extends away from the bottom edge of the main body.

In one embodiment, the support spline may be made of a rigid material. For example, in one exemplary embodiment, the support spline may be made from metal. More particularly, the support spline may be made from sheet metal. In one embodiment, the at least one upper flange may extend away from the top edge of the main body in a direction substantially perpendicular to the main body. Additionally, the at least one lower flange may extend away from the bottom edge of the main body in a direction substantially perpendicular to the main body. In one embodiment, a length of a pair of main body portions on opposed sides of the opening may be substantially equal.

In another aspect of the disclosure, a tray for facilitating fiber optic connections is disclosed. The tray includes a bottom panel, a plurality of walls extending from the bottom panel, where at least one of the plurality of walls of the tray includes a cutout, and an adapter region on the bottom panel and within the plurality of walls. The adapter region is configured to receive adapters which, in turn, are configured to receive fiber optic connectors of fiber optic cables for making fiber optic connections. The tray further includes at least one support spline in accordance with the first aspect described above coupled to the at least one wall of the plurality of walls having the cutout. The opening in the at least one support spline aligns with the cutout in the at least one wall of the tray to provide a passage for fiber optic cables to enter/exit the tray.

In one embodiment, the tray defines a front wall and a rear wall, and the cutout in the at least one of the plurality of walls may be in a rear wall of the tray. In this embodiment, the front wall of the tray may include a handle. The tray may further include a plurality of cable routing guides.

In another aspect of the disclosure, a distribution frame for a fiber optic network is disclosed. The distribution frame includes at least one housing connectable to the distribution frame and a plurality of trays according the second aspect described above movably connected the at least one housing.

In one embodiment, each of the plurality of trays may be slidable relative to the at least one housing. In one embodiment, the housing includes eight trays. In one embodiment, the distribution frame may include a plurality of housings. For example, the distribution frame may include four housings. In one embodiment, the distribution frame may be an intermediate distribution frame of a data center.

In yet another aspect of the disclosure, a method of making a support spline is disclosed. The method includes providing a spline body having an upper edge, a lower edge, a first side edge, and a second side edge, forming an opening in the spline body that is open along the upper edge and extends toward the lower edge, shaping the spline body along the upper edge to define at least one upper flange, and shaping the spline body along the lower edge to define at least one lower flange. In one embodiment, forming the opening may include forming a generally rectangular opening in the spline body. In one embodiment, shaping the spline body to define the at least one upper flange may include bending the spline body to define the at least one upper flange. Additionally, shaping the spline body to define the at least one lower flange may include bending the spline body to define the at least one lower flange.

In still a further aspect of the disclosure, a method of making a tray that facilitates fiber optic connections is disclosed. The method includes providing a tray. The tray includes a bottom panel, a plurality of walls extending from the bottom panel, and an adapter region on the bottom panel and within the plurality of walls. The adapter region is configured to receive adapters which, in turn, are configured to receive fiber optic connectors of fiber optic cables for making fiber optic connections. The method further includes forming a cutout in at least one of the plurality of walls, and connecting a spline support to the at least one of the plurality of walls having the cutout. The spline support includes a spline body having an upper edge, a lower edge, a first side edge, a second side edge, and an opening in the spline body that is open along the upper edge and extends toward the lower edge. According to the method, the spline support is connected to the at least one of the plurality of walls such that the opening in the spline support aligns with the cutout to provide a passage for fiber optic cables to enter/exit the tray.

BRIEF DESCRIPTION OF THE DRAWINGS

The accompanying drawings are included to provide a further understanding and are incorporated in and constitute a part of this specification. The drawings illustrate one or more embodiment(s), and together with the description serve to explain principles and operation of the various embodiments. Features and attributes associated with any of the embodiments shown or described may be applied to other embodiments shown, described, or appreciated based on this disclosure.

DETAILED DESCRIPTION

The exemplary embodiments described herein are provided for illustrative purposes and are not limiting. Other exemplary embodiments are possible, and modifications may be made to the exemplary embodiments within the scope of the present disclosure. Therefore, the description below is not meant to limit the scope of the present disclosure. In general, the description relates to a support spline for a tray. The description also relates to methods of making and installing the support spline.

Figure 1:
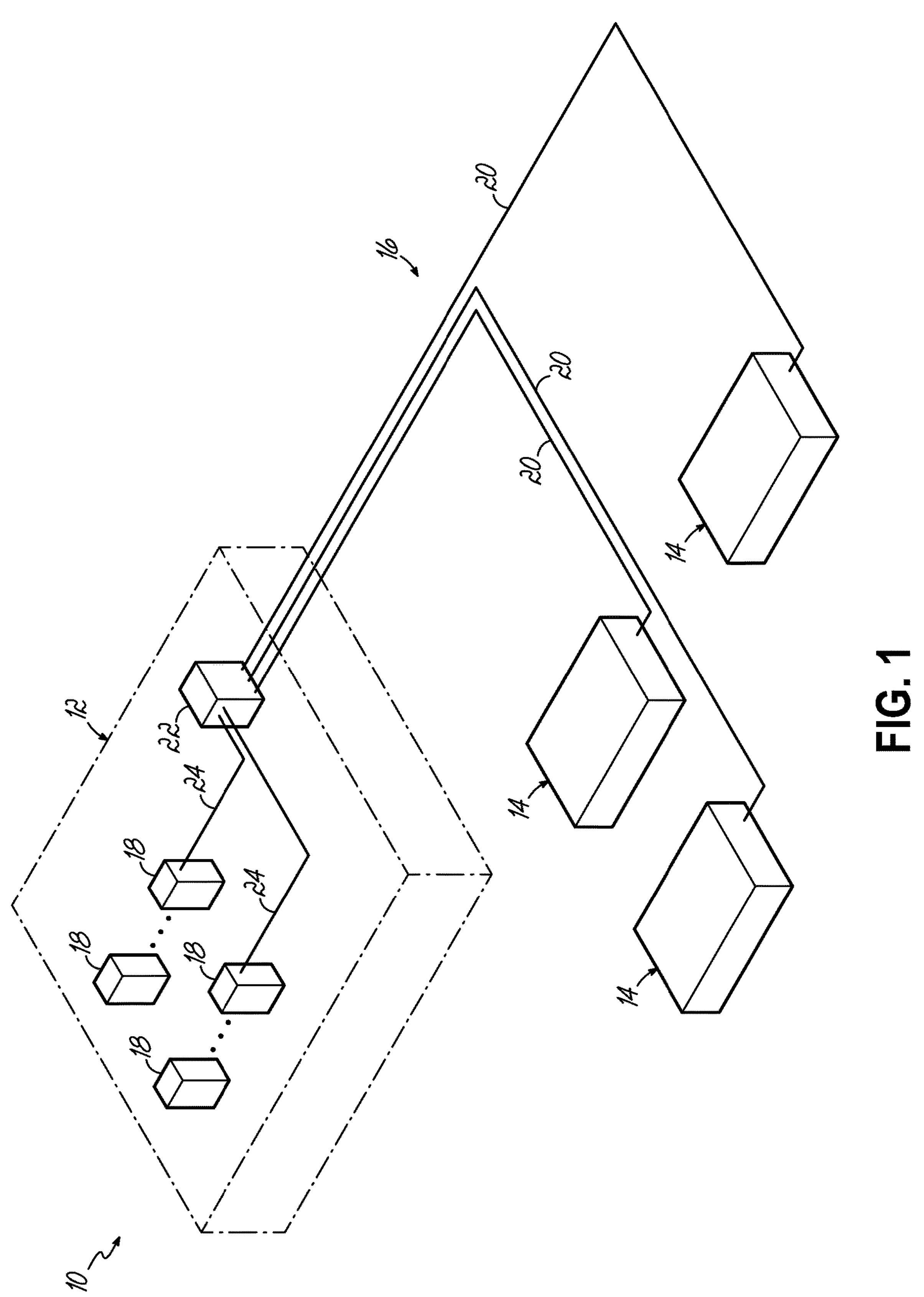
FIG. 1 is a schematic illustration of a data center campus according to an embodiment of the disclosure.

As illustrated in FIG. 1, a modern-day data center 10 may include a collection of buildings (referred to as a data center campus) having, for example, a main building 12 and one or more auxiliary buildings 14 in close proximity to the main building 12. While three auxiliary buildings 14 are shown, there may be more or less depending on the size of the campus. The data center 10 provides for a local fiber optic network 16 that interconnects the auxiliary buildings 14 with the main building 12. The local fiber optic network 16 allows network equipment 18 in the main building 12 to communicate with various network equipment (not shown) in the auxiliary buildings 14. In the exemplary embodiment shown, the local fiber optic network 16 includes trunk cables 20 extending between the main building 12 and each of the auxiliary buildings 14. Conventional trunk cables 20 generally include a high fiber-count arrangement of optical fibers for passing data and other information through the local fiber optic network 16. In the example illustrated in FIG. 1, the trunk cables 20 from the auxiliary buildings 14 are routed to one or more main distribution frames 22 housed in the main building 12 (one shown).

Within the main building 12, a plurality of indoor fiber optic cables 24 (also referred to as "indoor cables 24") are routed between the network equipment 18 and the one or more main distribution frames 22. The indoor cables 24 generally include a high fiber-count arrangement of optical fibers for passing data and other information from the main distribution frames 22 to the network equipment 18. Although only the interior of the main building 12 is schematically shown in FIG. 1 and discussed above, each of the auxiliary buildings 14 may house similar equipment for similar purposes. Thus, although not shown, each of the trunk cables 20 may be routed to one or more main distribution frames 22 in one of the auxiliary buildings 14 in a manner similar to that described above. Furthermore, each of the auxiliary buildings 14 may include indoor cables 24 that extend between network equipment 18 and the one or more main distribution frames 22 of the auxiliary building 14.

Figure 2:
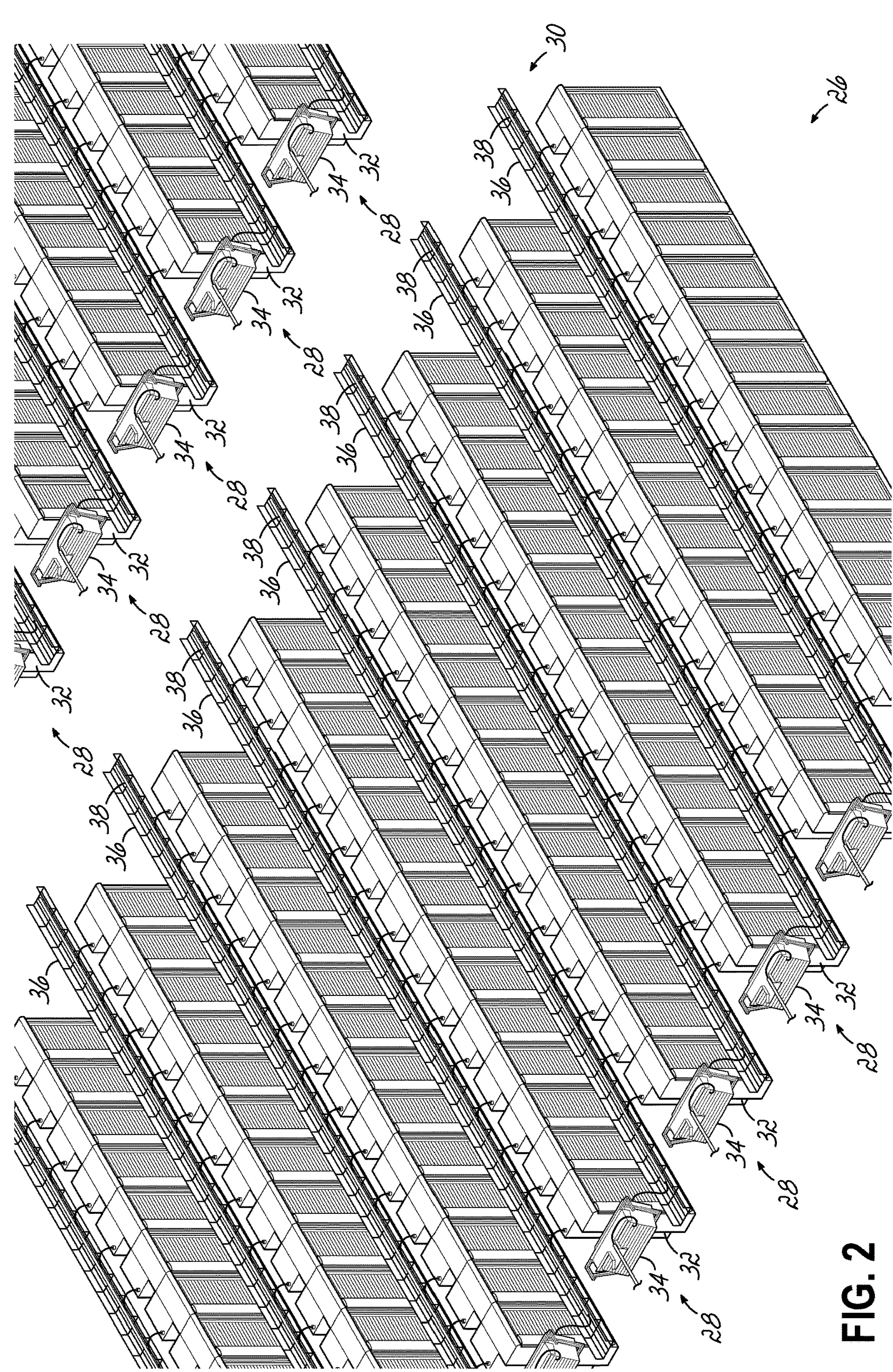
FIG. 2 is a partial perspective view of an embodiment of a data hall of the data center of FIG. 1.
Figure 3:
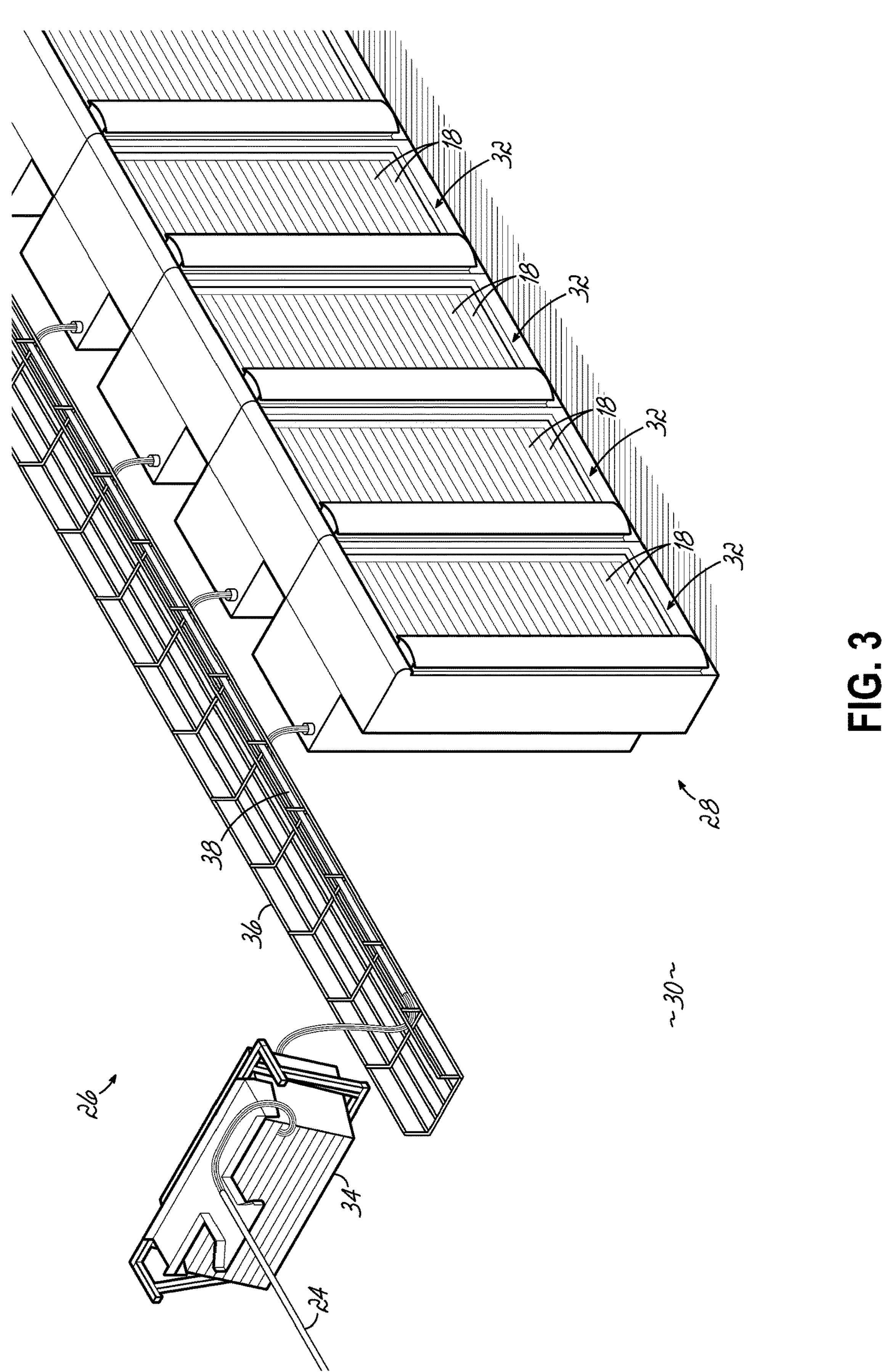
FIG. 3 is a schematic view of an embodiment of a row of equipment racks of the data hall of FIG. 2.

As illustrated in more detail in FIGS. 2 and 3, the network equipment 18 in the main building 12 or an auxiliary building 14 may be arranged in one or more data halls 26 that generally include a plurality of spaced-apart rows 28 on one or both sides of an access pathway 30. The arrangement of the data halls 26 into rows 28 helps organize the large number of equipment, fiber optic cables, fiber optic connections, etc. Each of the rows 28 includes a plurality of equipment racks or cabinets 32 (referred to hereafter as "racks 32") generally arranged one next to another along the row 28. Each of the racks 32 is a vertically arranged framework for holding various network equipment 18 of the data center 10, as is generally known in the telecommunications industry. In one common arrangement, and as further illustrated in FIG. 3, each row 28 may include an intermediate distribution frame 34 at the head end of the row 28 closest to the access pathway 30. The intermediate distribution frame 34 represents a termination point of at least some of the optical fibers carried by one or more of the indoor cables 24, for example. Although the intermediate distribution frame 34 is shown as being positioned above the row 28, in other embodiments the intermediate distribution frame 34 may be in a cabinet (not shown) at the head end of the row 28 or in the first rack 32 at the head end of the row 28. In yet other embodiments, the intermediate distribution frame 34 may be located within the associated row, such as in the middle of the row, and be above, below, or within one of the racks 32.

In a conventional arrangement, one or more distribution cables 38 are connected to the intermediate distribution frame 34 of a row 28 and routed along a cable tray 36 generally disposed above the row 28. The network equipment 18 in the racks 32 is then optically connected to the one or more distribution cables 38 to provide the interconnectivity of the network equipment 18 of the data center 10. A plurality of indoor cables 24 enter the intermediate distribution frame 34 on one side of the intermediate distribution frame 34 and distribution cables 38 leave the intermediate distribution frame 34 from the opposing side. The distribution cables 38 are positioned in the cable trays 36 and, where appropriate, a subset of the distribution cables 38 drop down and enter a particular equipment rack 32 and connect to network equipment 18 inside the equipment rack 32.

Figure 4:
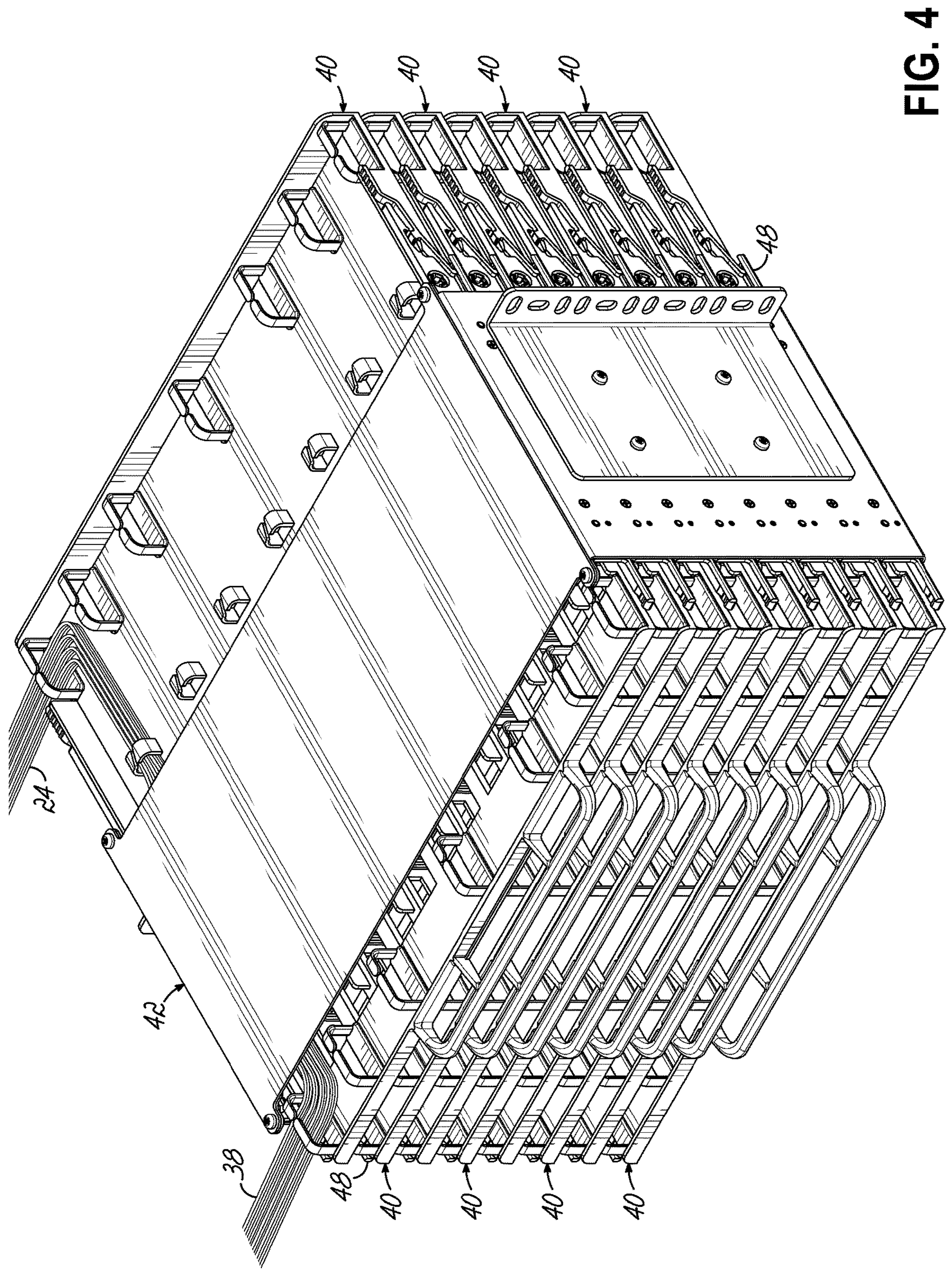
FIG. 4 is a perspective view of a housing shell including a number of trays according to an embodiment of the disclosure.

With reference to FIG. 4, the intermediate distribution frame 34 may include one or more trays 40 according to an embodiment of the invention. To optimize tray 40 density within the housing shell 42, the trays 40 are vertically stacked as close to one another as possible within the housing shell 42. The housing shell 42 in the depicted embodiment is approximately five rack units high. However, it is to be understood that the housing shell 42 could be more or less tall—one, two, or three rack units high, for example. The depicted housing shell 42 includes eight separate trays 40 vertically stacked in, surrounded by, and removably attached to the housing shell 42 that forms part of the intermediate distribution frame 34. However, it is to be understood that fewer or more trays 40 may be included in the housing shell 42 in alternative embodiments. Further, it is to be understood that more than one housing shell 42 could be included in the intermediate distribution frame 34. For example, an intermediate distribution frame 34 could include two or more housing shells 42 (and trays 40 therein).

Figure 5:
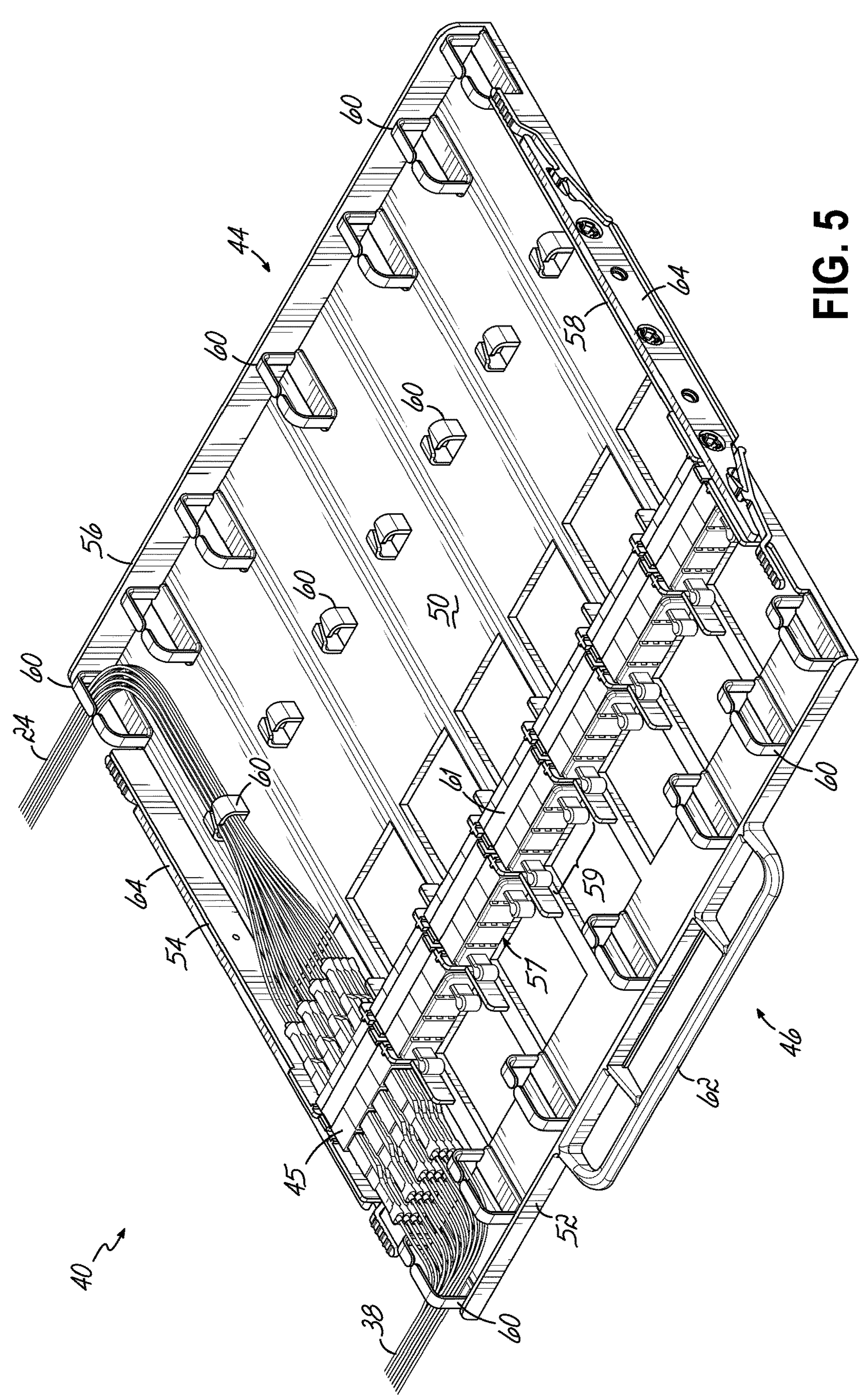
FIG. 5 is a perspective view of an embodiment the tray of FIG. 4.

Each of the trays 40 may slide into the housing shell 42 from the front or the back of the housing shell 42 independent of each other. In one embodiment, indoor cables 24 enter a back portion 44 of the tray 40 and are connected to one end of an adapter 45 (FIG. 5). Corresponding distribution cables 38 enter a front portion 46 of the tray 40 and are connected to another (e.g., opposing) end of the adapter 45 (FIG. 5). Movement (e.g., sliding) of the tray 40 back and forth within the housing shell 42 allows for a tray 40 to be extended from a resting position and provides access to cables 24, 38 and adapters 45 within the tray 40. In use, signals from the network equipment 18 in the racks 32 are transmitted through the distribution cables 38, through the adapters 45, and through the indoor cables 24, and vice versa. In other words, the information may travel in both directions along the indoor cables 24 and the distribution cables 38.

With continued reference to FIG. 4, the housing shell 42 may include a pair of housing rails or slides 48 on opposing sides of the housing shell 42. Each pair of housing rails 48 is configured to receive a single tray 40. The housing shell 42 may be sized to accommodate one or more trays 40 with a corresponding number of pairs of housing rails or slides 48. Thus, while the housing shell 42 in FIG. 4 is sized to accommodate eight trays 40 and, therefore, have eight pairs of housing rails 48, the housing shell 42 may be sized to accommodate less or more than eight trays 40 (and thus have more or less than eight pairs of housing rails 48).

Figure 6:
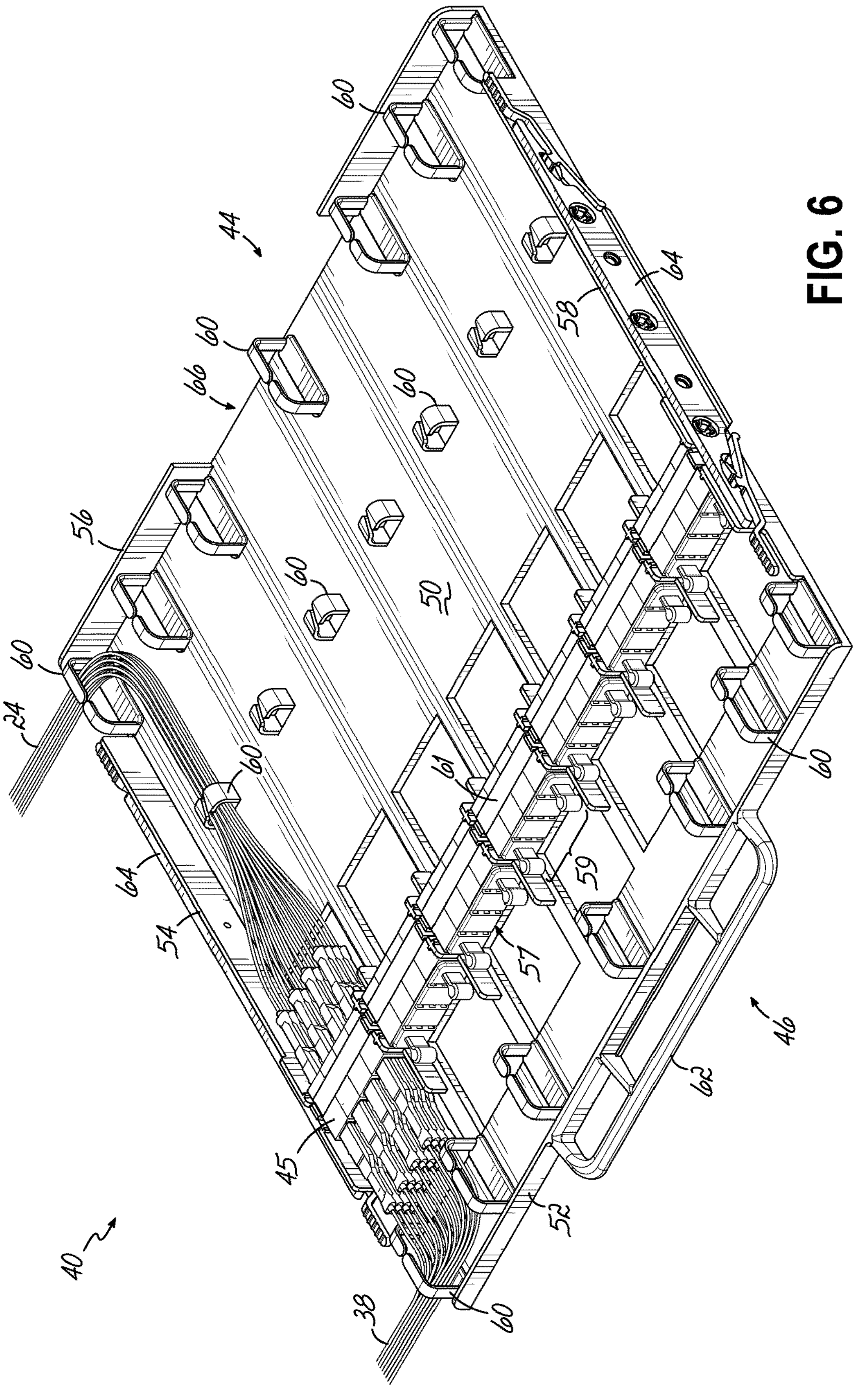
FIG. 6 is a perspective view of an alternative embodiment of the tray of FIG. 4, the tray including a cut-out portion.

Referring now to FIGS. 5 and 6, the figures show an individual tray 40. The tray 40 may be made of plastic and may be approximately 19 inches wide, for example, to fit a standard 19-inch equipment rack 32. In other words, the tray 40 may be configured for a 19-inch equipment rack 32. It should be understood, however, that the tray 40 could be made from alternative materials and could be alternatively sized. The tray 40 includes a bottom panel 50 with adjoining first, second, third, and fourth walls 52, 54, 56, 58. For purposes of orientation only, the first wall 52 may be considered at the front of the tray 40 (as the tray 40 is oriented in FIG. 5), the second wall 54 may be considered at the left of the tray 40 (as the tray 40 is oriented in FIG. 5), the third wall 56 may be considered at the back of the tray 40 (as the tray 40 is oriented in FIG. 5), and the fourth wall 58 may be considered at the right of the tray 40 (as the tray 40 is oriented in FIG. 5). The tray 40 also includes a plurality of cable routing guides 60 extending from the bottom panel 50. The cable routing guides 60 help secure the indoor cables 24 and the distribution cables 38 in a desired routing as the cables 24, 38 enter the back and front portions 44, 46 of the tray 40 so the cables 24, 38 may be connected to the adapters 45 in an orderly fashion.

In the embodiment of the tray 40 depicted in FIG. 5, up to seven interface assemblies 57 (consisting of ganged adapters 59 in interface housings 61) may be coupled to the tray 40 at an adapter region. In other embodiments, the adapter region of a tray 40 may be configured to hold less than seven interface assemblies 57 or more than seven interface assemblies 57. In the depicted embodiment, the housing shell 42 accommodates eight trays 40 with each tray 40 accommodating seven interface assemblies 57; with each interface assembly 57 having four adapters 45; where each adapter 45 may receive four individual cables 24, 38 on either side of each adapter 45; and where each cable 24, 38 contains 24 optical fibers. In this embodiment, there are a total of 28 adapters 45 and thus 112 cables 24, 38 coming into one side of the adapters 45 for a total of 2,688 optical fibers on one side of the adapters 45. There would be another 2,688 corresponding optical fibers coming into the other side of the adapters 45. Thus, in this embodiment, each tray 40 accommodates 2,688 fiber optic connections. For a housing shell 42 having eight trays 40, there would be 21,504 fiber optic connections associated therewith. Moreover, for an intermediate distribution frame 34 having two housing shells 42, there would be 43,008 fiber optic connections.

With continued reference to FIG. 5, the tray 40 may also include a handle 62. In the depicted embodiment, the handle 62 is mounted to the first (e.g., front) wall 52. The tray 40 may also include tray rails 64 mounted to the second and fourth walls 54, 58, respectively. Thus, a first tray rail 64 may be considered at the left of the tray 40 and a second tray rail 64 may be considered at the right of the tray 40. In use, the tray 40 (e.g., by the tray rails 64) may be slid into the housing shell 42 along the pair of housing rails 48 from either the back side of the housing shell 42 or the front side of the housing shell 42.

Referring specifically to FIG. 6, the illustrated tray 40 includes a cut-out portion 66 in the third wall 56 (e.g., back portion 44) of the tray 40. Material of the tray 40 (e.g., plastic) is removed in the cut-out portion 66 to allow for the indoor cables 24, for example, to enter or exit through the back portion 44 (e.g., rear) of the tray 40, as opposed to a side (e.g., second or fourth wall 54, 58) of the tray 40 (as shown in FIG. 5, for example). Removal of the cut-out portion 66 of the third wall 56 section may create a structural weak point in the tray 40 that could result in sagging or bending of the tray 40. In other words, removing the cut-out portion 66 of the tray 40 could reduce the structural rigidity of the tray 40 such that the tray 40 with the cut-out portion 66 removed no longer remains planar. Such sagging or bending of the tray 40 could pose a problem. For example, a tray 40 sagging or bending in the housing shell 42 can cause the tray 40 to interfere with other trays 40 stacked in the housing shell 42. The interference is particularly pronounced when one tries to slide a tray 40 located below the sagging or bending tray 40 into or out of the housing shell 42. Such interference could prohibit access to the tray 40 and the cables 24, 38 and adapters 45 thereon.

Figures 7, 8:
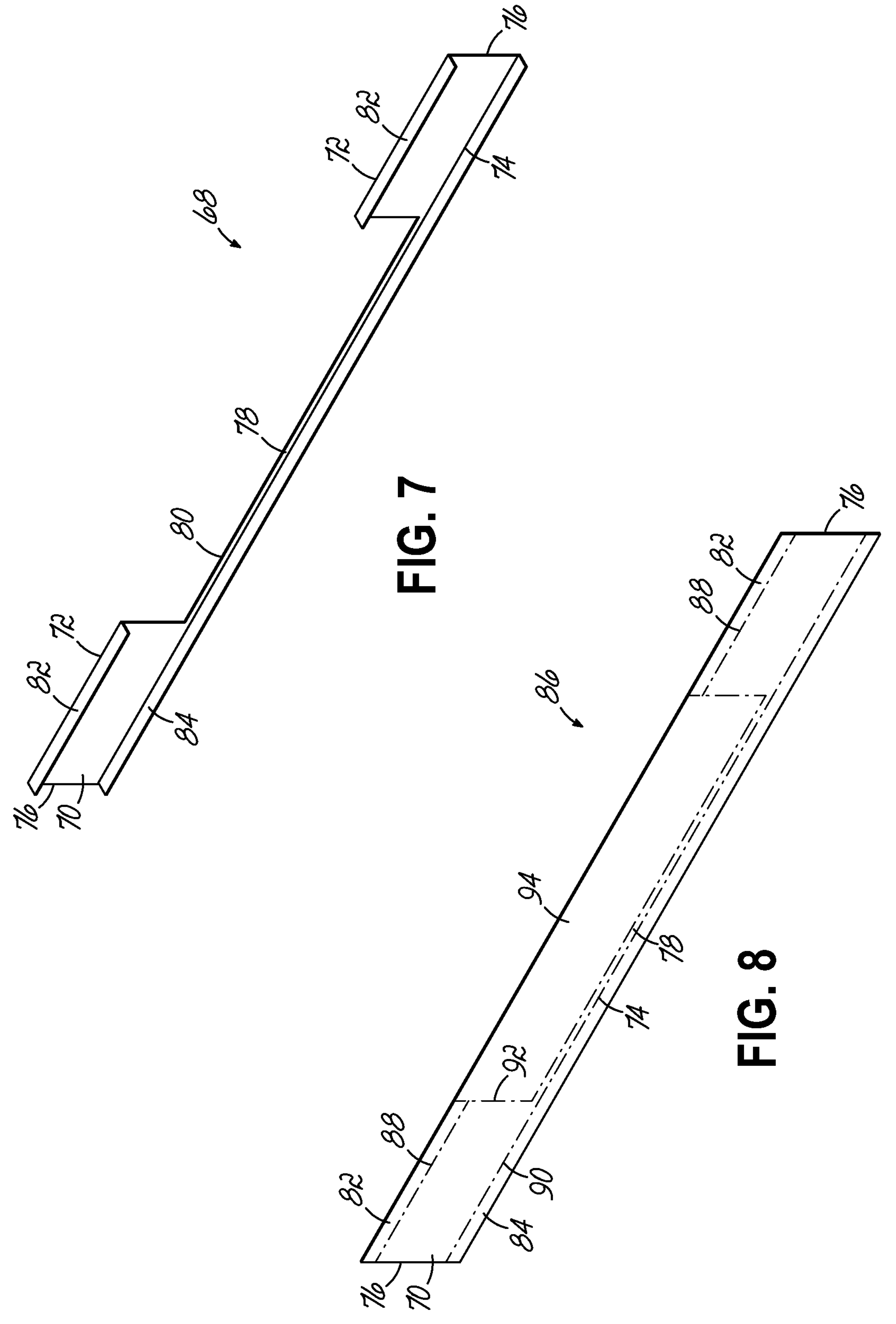
FIG. 7 is a perspective view of a support spline according to an embodiment of the disclosure.
FIG. 8 is a perspective view of an embodiment of the support spline of FIG. 7, showing the support spline prior to manufacture.
Figure 9:
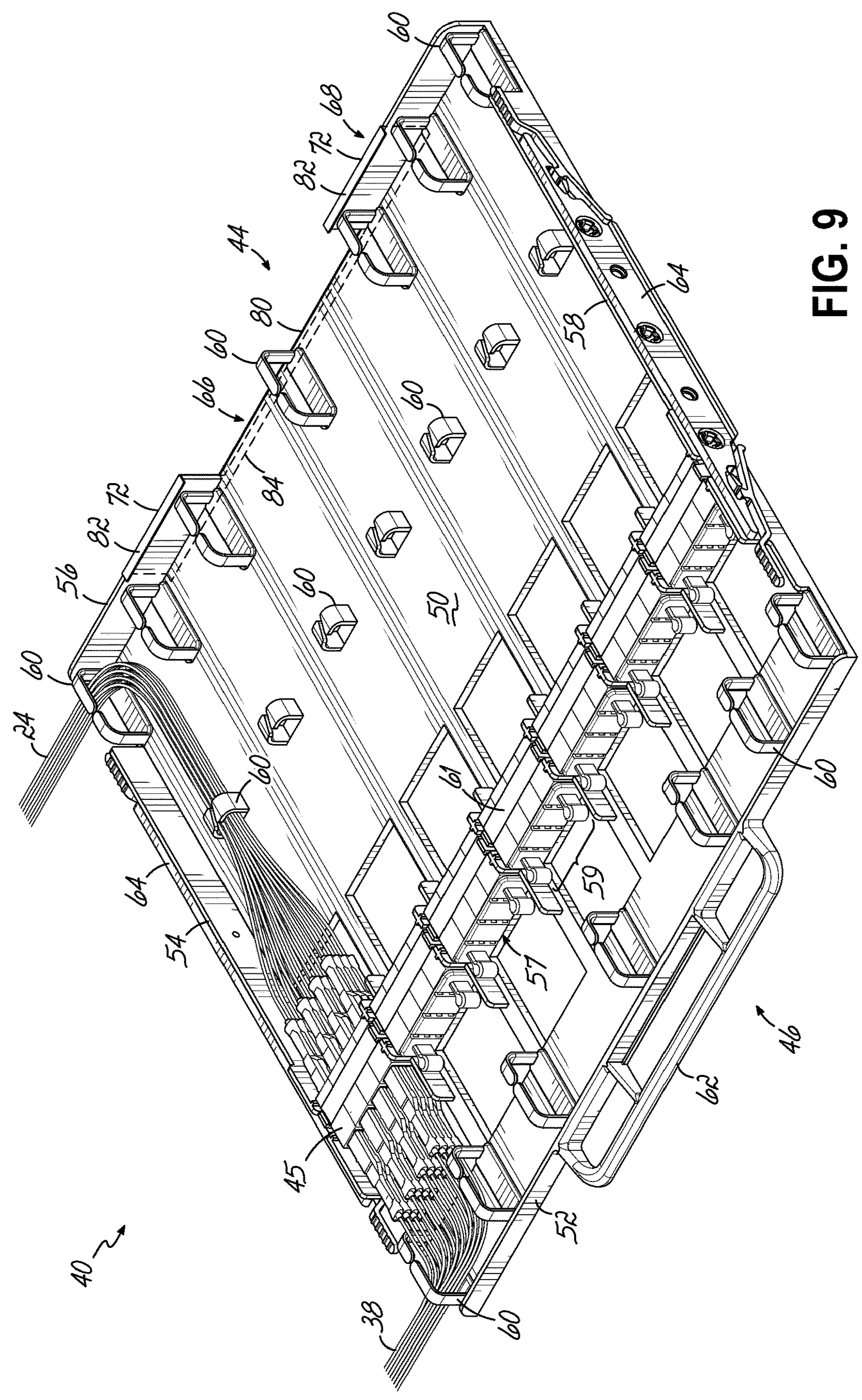
FIG. 9 is a partial perspective view of an embodiment of the tray of FIG. 6 including an embodiment of the support spline of FIG. 7.

Referring now to FIGS. 7-9, a support spline 68 and its application to a tray 40 is shown. The support spline 68 is configured to address the potential problem of sagging or bending of the tray 40 to allow multiple trays 40 to be vertically stacked in a housing shell 42 without interference from neighboring trays 40. Particularly, the geometry of the support spline 68 minimizes or eliminates sagging or bending of a tray 40. The support spline 68 may be made of metal, for example. If formed of metal, the support spline 68 can be cut and bent into shape from sheet metal, as will be described in further detail below with respect to FIG. 8. It should be understood, however, that the support spline 68 could be made from alternative materials, such as plastic(s), for example.

Referring specifically to FIG. 7, the support spline 68 is shown as a component separate from the tray 40. In one embodiment, the support spline 68 may be a discrete component that can be added to an existing tray 40. However, in an alternative embodiment, the support spline 68 may be integral to (i.e., part of) the tray 40 such that the integrated support spline 68 would not extend the overall height or width of the tray 40 and, further, would appear homogenous to the walls 52, 54, 56, 58 of the tray 40.

In one embodiment, the support spline 68 includes a planar main body 70. The main body 70 is bound by a top edge 72, bottom edge 74, and lateral edges 76. In use, the main body 70 of the support spline 68 is located against a third (e.g., rear) wall 56 of the tray 40. In a central portion 78 of the main body 70 there is an opening or notch 80. The roughly rectangular opening 80 extends from the central portion 78 of the main body 70 to a top edge 72 of the main body 70. The opening 80 generally forms a pair of main body portions on opposed sides of the opening 80. As shown, each main body portion is generally rectangular and substantially equal in size and shape. The opening 80 of the support spline 68 is dimensioned the same as or similar to the cut-out portion 66 of the tray 40. In use, the opening 80 of the support spline 68 is located adjacent the cut-out portion 66 of the tray 40 such that the indoor cables 24, for example, could extend through both the cut-out portion 66 of the tray 40 and the opening 80 of the support spline 68 (FIG. 9). The main body 70 including the cut-out portion 66 is roughly U-shaped.

With continued reference to FIG. 7, the support spline 68 further includes a pair of upper flanges 82 extending perpendicularly from the top edge 72 away from the main body 70 of the support spline 68. In use, the upper flanges 82 extend over a top of the third (e.g., rear) wall 56 of the tray 40 and secure the support spline 68 to the tray 40 (FIG. 9). Additionally, the support spline 68 includes a lower flange 84 extending perpendicularly from the bottom edge 74 away from the main body 70 of the support spline 68 in the same direction as the upper flanges 82. In use, the lower flange 84 extends over a bottom of the third (e.g., rear) wall 56 of the tray 40 and secure the support spline 68 to the tray 40 (FIG. 9).

Referring now to FIG. 8, a method of forming or making the support spline 68 shown in FIG. 7 from a blank 86, such as a sheet metal blank, will now be described. With respect to the blank 86 shown in FIG. 8, like reference numerals represent like features compared to the spline 68 described above with respect to FIG. 7. The blank 86 includes a pair of upper bend lines 88 used to form the pair of upper flanges 82. In that regard, each upper flange 82 is formed by bending the upper flange 82 along the upper bend line 88 to an approximately perpendicular position relative the main body 70, as shown in FIG. 7. To that end, the upper bend lines 88 generally corresponds to the top edge 72 of the spline 68. The blank 86 further includes a lower bend line 90 that extends between the pair of lateral edges 76. The lower bend line 90 is used to form the lower flange 84, which is formed by bending the lower flange 84 along the lower bend line 90 to an approximately perpendicular position relative the main body 70. To that end, the lower bend line 90 generally correspond to the bottom edge 74 of the spline 68. The blank 86 further includes a score line 92 that defines a knockout 94 that corresponds to the size of the rectangular opening 80 in the spline 68. To that end, the knockout 94 is configured to be removed from the blank 86 to form the opening 80.

Figure 10:
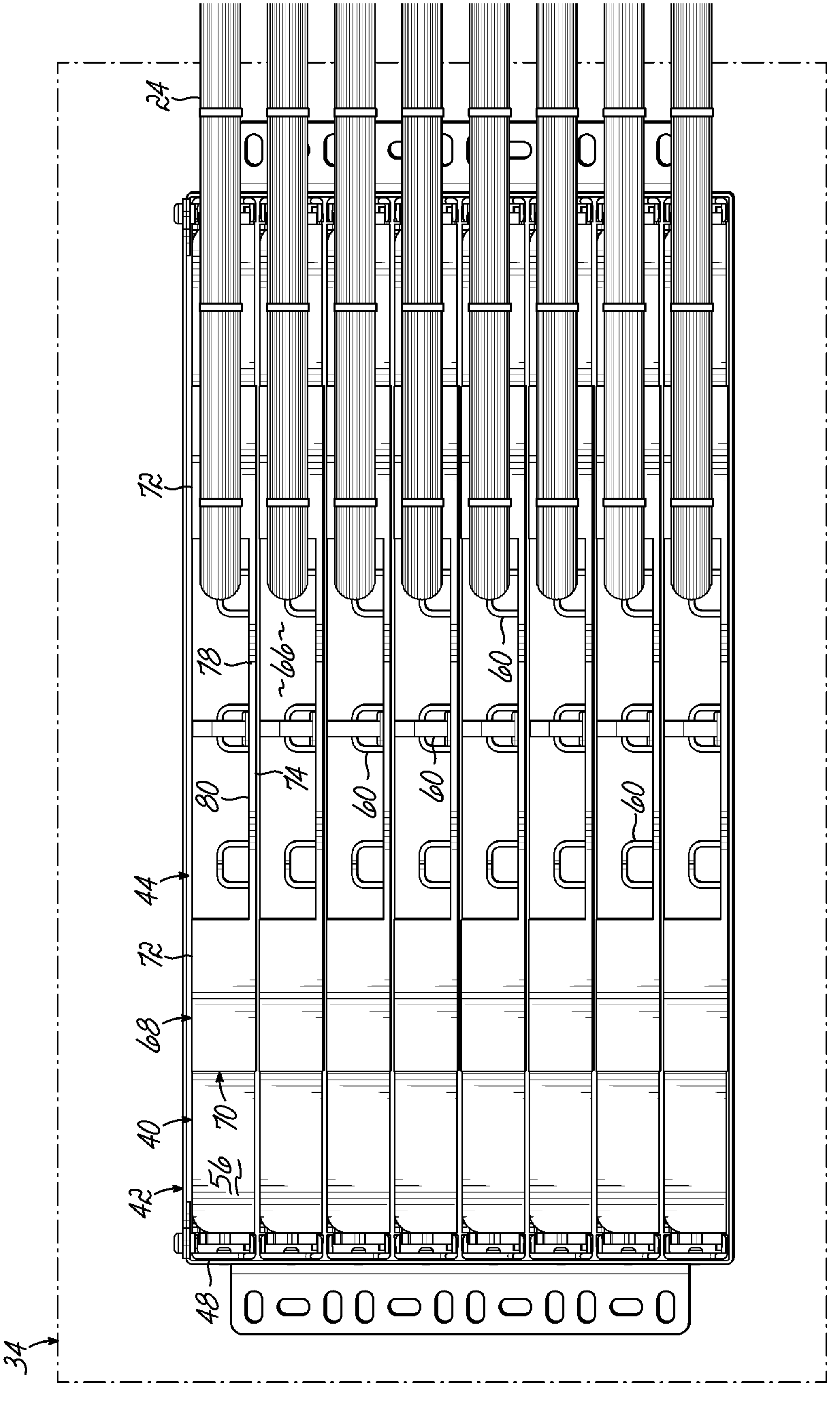
FIG. 10 is a pictorial view of an embodiment of an intermediate distribution frame including a number of trays including support splines of FIG. 9.

Referring now to FIG. 10, the Figure shows an exemplary housing shell 42 including a number of trays 40 within an intermediate distribution frame 34. The housing shell 42 may include both full-length and reduced length trays 40, and the support spline 68 may be used with both full-length and reduced length trays 40. When used with a reduced length tray 40, the support spline 68 helps to significantly reduce the depth of the tray 40 as compared to a full-length tray 40.

As shown, the cut-out portion 66 of the each tray 40 and the support spline 68 are configured to align to provide a passage to facilitate entry/exit of the indoor cables 24, for example, in the back portion 44 of the tray 40. This entry/exit of the indoor cables 24 through the back portion 44 of the tray 40 increases the slack available to move the trays 40 within the housing shell 42 and promotes additional slack management for the tray 40. In other words, entry/exit of the indoor cables 24 through the back portion 44 of the tray 40 allows for the tray 40 to better slide forward or backward from the resting position of the tray 40 within the housing shell 42 as compared to a full-length tray 40 without the cut-out portion 66 and/or support spline 68. Such is beneficial to a user attempting to access the adapters 45 of the tray 40, for example.

With continued reference to FIG. 10, inclusion of the support spline 68 on the trays 40 minimizes or eliminates sagging or bending of trays 40 vertically stacked in the housing shell 42. The support spline 68 stiffens (reinforces) the trays 40 and thus maintains the assigned vertical spacing and clearance between the trays 40 in the housing shell 42.

While the present disclosure has been illustrated by the description of specific embodiments thereof, and while the embodiments have been described in considerable detail, it is not intended to restrict or in any way limit the scope of the appended claims to such detail. The various features discussed herein may be used alone or in any combination within and between the various embodiments. Additional advantages and modifications will readily appear to those skilled in the art. The disclosure in its broader aspects is therefore not limited to the specific details, representative apparatus and methods and illustrative examples shown and described. Accordingly, departures may be made from such details without departing from the scope of the disclosure.

What is claimed is:

1. A tray for facilitating fiber optic connections, comprising:
- a bottom panel;
- a plurality of walls extending from the bottom panel, wherein at least one of the plurality of walls of the tray includes a cutout;
- an adapter region on the bottom panel and within the plurality of walls, the adapter region configured to receive adapters which, in turn, are configured to receive fiber optic connectors of fiber optic cables for making fiber optic connections; and
- a support spline coupled to the at least one wall of the plurality of walls having the cutout, the support spline comprising:
  - a planar main body including a top edge, a bottom edge, and two lateral edges;
  - an opening in a central portion of the main body, the opening extending from the central portion of the main body to the top edge of the main body;
  - at least one upper flange extending away from the top edge of the main body; and
  - at least one lower flange extending away from the bottom edge of the main body; and
- wherein the opening in the at least one support spline aligns with the cutout in the at least one wall of the tray to provide a passage for fiber optic cables to enter/exit the tray.

2. The support spline of claim 1, wherein the support spline is made of a rigid material.

3. The support spline of claim 2, wherein the support spline is made of sheet metal.

4. The support spline of claim 1, wherein the at least one upper flange extends away from the top edge of the main body in a direction substantially perpendicular to the main body.

5. The support spline of claim 1, wherein the at least one lower flange extends away from the bottom edge of the main body in a direction substantially perpendicular to the main body.

6. The support spline of claim 1, wherein a length of a pair of main body portions on opposed sides of the opening is substantially equal.

7. The tray of claim 1, wherein the tray defines a front wall and a rear wall, and wherein the cutout in the at least one of the plurality of walls is in the rear wall of the tray.

8. The tray of any of claim 7, wherein the front wall includes a handle.

9. The tray of any of claim 1, wherein the tray further comprises a plurality of cable routing guides.

10. A distribution frame for a fiber optic network, comprising:
- at least one housing connectable to the distribution frame; and
- a plurality of trays each according to claim 1 movably connected the at least one housing.

11. The distribution frame of claim 10, wherein each of the plurality of trays are slidable relative to the at least one housing.

12. The distribution frame of claim 11, wherein the housing includes eight trays.

13. The distribution frame of any of claim 12, wherein the distribution frame includes a plurality of housings.

14. The distribution frame of claim 13, wherein the distribution frame includes four housings.

15. The distribution frame of any of claim 10, wherein the distribution frame is an intermediate distribution frame of a data center.

16. A method of making a support spline, comprising:
- providing a generally rectangular spline body having an upper edge, a lower edge, a first side edge, and a second side edge;
  - wherein the spline body further includes a knockout;
- forming an opening in the spline body by removing the knockout, the opening is open along the upper edge and extends toward the lower edge;
- shaping the spline body along the upper edge to define at least one upper flange; and
- shaping the spline body along the lower edge to define at least one lower flange.

17. The method of claim 16, wherein forming the opening includes forming a generally rectangular opening in the spline body.

18. The method of claim 16, wherein shaping the spline body to define the at least one upper flange includes bending the spline body to define the at least one upper flange.

19. The method of any of claim 16, wherein shaping the spline body to define the at least one lower flange includes bending the spline body to define the at least one lower flange.

20. A method of making a tray that facilitates fiber optic connections, comprising:
- providing a tray comprising:
  - a bottom panel;
  - a plurality of walls extending from the bottom panel; and
  - an adapter region on the bottom panel and within the plurality of walls, the adapter region configured to receive adapters which, in turn, are configured to receive fiber optic connectors of fiber optic cables for making fiber optic connections,
- forming a cutout in at least one of the plurality of walls; and
- connecting a spline support to the at least one of the plurality of walls having the cutout, the spline support comprising a spline body having an upper edge, a lower edge, a first side edge, and a second side edge, and an opening in the spline body that is open along the upper edge and extends toward the lower edge,
- wherein the spline support is connected to the at least one of the plurality of walls such that the opening in the spline support aligns with the cutout to provide a passage for fiber optic cables to enter/exit the tray.

* * * * *